(12) United States Patent
Kondoh (10) Patent No.: US 7,932,459 B2
(45) Date of Patent: Apr. 26, 2011

(54) THERMAL ENERGY TRANSFER CIRCUIT SYSTEM

(75) Inventor: Yoshiomi Kondoh, Gunma (JP)

(73) Assignees: Meidensha Corporation, Tokyo (JP); Yoshiomi Kondoh, Maebashi-shi (JP)

( * ) Notice: Subject to any disclaimer, the term of this patent is extended or adjusted under 35 U.S.C. 154(b) by 978 days.

(21) Appl. No.: 11/667,362

(22) PCT Filed: Nov. 16, 2005

(86) PCT No.: PCT/JP2005/020994
§ 371 (c)(1),
(2), (4) Date: May 9, 2007

(87) PCT Pub. No.: WO2006/054567
PCT Pub. Date: May 26, 2006

(65) Prior Publication Data
US 2008/0092939 A1 Apr. 24, 2008

(30) Foreign Application Priority Data

Nov. 16, 2004 (JP) ................................. 2004-332286
Jan. 27, 2005 (JP) ................................. 2005-019981

(51) Int. Cl.
*H01L 35/28* (2006.01)
(52) U.S. Cl. ......................................... 136/211; 136/212
(58) Field of Classification Search .................. 136/211, 136/212
See application file for complete search history.

(56) References Cited

U.S. PATENT DOCUMENTS

| 5,006,178 | A | * | 4/1991 | Bijvoets | 136/211 |
| 5,515,683 | A | * | 5/1996 | Kessler | 62/3.7 |
| 5,987,891 | A | * | 11/1999 | Kim et al. | 62/3.6 |
| 6,100,600 | A | * | 8/2000 | Pflanz | 290/54 |
| 6,271,459 | B1 | * | 8/2001 | Yoo | 136/201 |
| 6,314,741 | B1 | * | 11/2001 | Hiraishi | 62/3.7 |
| 2003/0230332 | A1 | * | 12/2003 | Venkatasubramanian et al. | 136/205 |
| 2004/0226599 | A1 | | 11/2004 | Kondoh | |
| 2006/0016469 | A1 | | 1/2006 | Kondoh | |

FOREIGN PATENT DOCUMENTS

| JP | 63-043449 U | 3/1988 |
| JP | 4-017148 U | 2/1992 |
| JP | 2003-092433 A | 3/2003 |
| JP | 2004-193177 A | 7/2004 |

* cited by examiner

*Primary Examiner* — Alexa D Neckel
*Assistant Examiner* — Golam Mowla
(74) *Attorney, Agent, or Firm* — Foley & Lardner LLP (57) ABSTRACT

A first conductive member and a second conductive member having different Seebeck coefficients are joined together by a joining member to form a plurality of thermoelectric conversion elements, and these thermoelectric conversion elements are disposed in at least two different temperature environments. The first conductive members of respective thermoelectric conversion elements or the second conductive members thereof are connected to each other by an electric wiring to form a direct energy conversion electric circuit system, and electric potential energy is picked up from an arbitrary portion on this electric wiring. Accordingly, the direct energy conversion electric circuit system from thermal energy to electric energy is formed. A water electrolyzer is disposed in the passage of the circuit system in which the first conductive members or second conductive members having connected respective thermoelectric conversion elements are connected to thereby able to convert thermal energy into chemical energy and sore it.

5 Claims, 9 Drawing Sheets

THERMAL ENERGY TRANSFER CIRCUIT SYSTEM

TECHNICAL FIELD

The present invention relates to a system with no external power supply for utilization of a thermal source exhausted or generated purely in the global environment, and conversion to electric energy or chemical energy. For example, the present invention relates to thermal energy existing in any section, space or region (hereinafter referred to as "space, etc.") of a building, an object, etc. whose temperature is high under the influence of an external heat originating from electrical devices, combustion devices, their related devices, sunlight, geothermal heat, etc., and relates to a thermal energy transfer circuit system for transferring such thermal energy to a remote place distant from the space, etc., and to a system for converting such thermal energy directly to electric energy and supplying it.

Moreover, the present invention relates to a conversion to chemical energy resource and storage system for converting thermal energy to chemical energy, and storing it, in order to utilize effectively the electric energy produced by the direct conversion and the transferred thermal energy.

BACKGROUND ART

Currently, in the world, energy is used mostly in irreversible manners to thermal energy. In order to prevent such thermal energy from being exhausted or to remove the exhausted thermal energy, forced air cooling or forced cooling utilizing energy supplied by an additional heat engine or electric energy is carried out. This causes an increase in energy consumption, and noises generated in such cooling device, and thereby causes problems.

Also when the temperature of a building or regions surrounding it is high under the influence of radiation of sunlight, geothermal heat, etc., forced air cooling or forced water cooling utilizing energy supplied by an additional heat engine or electric energy is carried out in order to exhaust or remove the thermal energy of this section of high temperature. This causes an increase in energy consumption, and noises generated in such cooling device, and thereby causes problems.

However, currently, the effort to reduce loads to the environment by saving energy by actively recycling such thermal energy, or by reducing noises, has been just started. The technique to recycle actively generated thermal energy without additional use of thermal or electric energy is not yet completed. Moreover, the noises generated in cooling devices, etc. are not yet reduced sufficiently.

Although thermal energy exists inexhaustibly in the natural world as described above, the technique to take out the thermal energy in the form of electric energy or chemical energy is still in an initial stage of development far from practical use.

However, conversion from thermal energy to electric energy, and conversely from electric energy to thermal energy, is possible according to principles of physics which has been known as Peltier effect and Seebeck effect for a long time. That is, radiating or absorbing heat is produced other than Joule heat, when current flows through conductors of two different kinds which are connected and held at a uniform temperature. This effect is the phenomenon first discovered by J. C. A. Peltier in 1834, and called Peltier effect. Moreover, when conductive wires of two different kinds are connected, the two contact points are held at different temperatures T1 and T2, and one of the conductive wires is cut, then an electromotive force is produced between the cut ends. This phenomenon was first discovered by J. J. Seebeck in 1821. The electromotive force generated between the two ends is called thermal electromotive force, and this phenomenon is called Seebeck effect in honor of the discoverer. In other words, the Peltier effect is a principle of conversion from electricity to thermal energy, while the Seebeck effect is a principle of conversion from thermal energy (temperature difference) to electric energy.

The development of a thermoelectric conversion element (Seebeck element) utilizing the Seebeck effect is attracting attention as substitute energy for fossil fuel and atomic power. The thermo-electromotive force of the Seebeck element is dependent on the temperatures of the two contact points, and moreover on the materials of the two conductor wires. A derivative value obtained by dividing the thermo-electromotive force by a temperature variation is called Seebeck coefficient. The thermoelectric conversion element is formed by contacting two conductors (or semiconductors) different in the Seebeck coefficient. Due to difference in the number of free electrons in the two conductors, electrons move between the two conductors, resulting in a potential difference between the two conductors. If thermal energy is applied to one contact point, the movement of free electrons is activated at the contact point, but the free electron movement is not activated at the other contact point being provided with no thermal energy. This temperature difference between the contact points, that is the difference in the activation of free electrons, causes conversion from thermal energy to electric energy. This effect is generally referred to as thermoelectric effect.

In general, the Seebeck element is an integrated element of a heating portion (higher temperature side) and a cooling portion (lower temperature side). A thermoelectric conversion element utilizing the Peltier effect (referred to as "Peltier element") also is an integrated element of a heat-absorbing portion and a heat-generating portion. Accordingly, the heating portion and the cooling portion interfere with one another in the Seebeck element, while the heat-absorbing portion and the heat-generating portion interfere with one another in the Peltier element. As a result, the Seebeck effect or the Peltier effect decays with time. Therefore, it is impractical to construct large-scale energy conversion equipment with such Peltier element and Seebeck element, because physical restriction is imposed by the place where the equipment is disposed.

The inventor (applicant) of the present application has invented and proposed a thermoelectric conversion apparatus utilizing the Seebeck effect and an energy conversion system utilizing this (cf. patent document 1). According to patent document 1, a circuit system constructed with the Seebeck element or the Peltier element is limited to a system including an external power supply, and used in limited forms.

Figure 10:
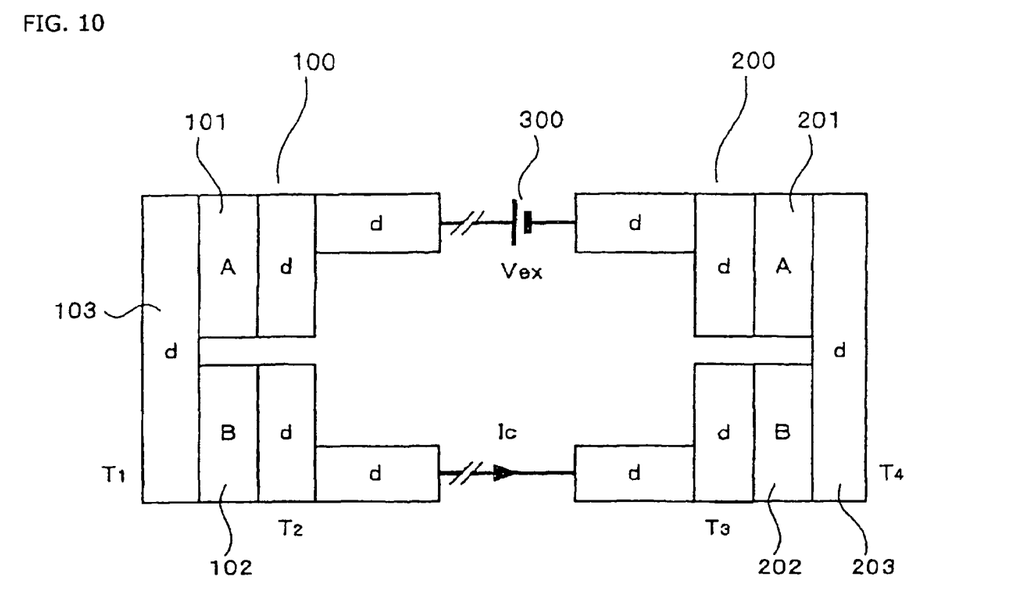
FIG. 10 is a schematic diagram showing an example of a conventional thermal energy transfer circuit system utilizing the Peltier effect.

FIG. 10 is a schematic diagram showing a long distance thermal energy transfer system utilizing the Peltier effect which has been proposed in patent document 1 by the inventor (applicant) of the present application. As shown in FIG. 10, two thermoelectric conversion elements 100 and 200 are provided so as to face one another. Each thermoelectric conversion element 100 (200) is constructed by joining together a first conductive member A101 (A201) and a second conductive member B102 (B202) having different Seebeck coefficients by a joining member d103 (d203) made of a material having a high thermal conductivity and electrical conductivity (for example, copper, gold, platinum, and aluminum).

The surface of the first conductive member A101 and the second conductive member B102 of the thermoelectric conversion element 100 which are opposed to the joining member d103, and the surface of the first conductive member A201 and the second conductive member B202 of the thermoelectric conversion element 200 which are opposed to the joining member d203, are connected by a conductive material having a high thermal conductivity (a wiring material made of copper, gold, platinum, aluminum, etc.), respectively. An external direct-current power supply 300 (Vex) is provided on the line connecting the first conductive members. A paired Peltier effect heat transfer electric circuit system is thus provided, having the joining members d103 and d203 as the heat-absorbing side and the heat-generating side, respectively.

The length of the above-described conductive material is required to be so long that the thermoelectric conversion element 100 and the thermoelectric conversion element 200 do not thermally interfere with one another. However, it is possible theoretically to set the length within a range from small lengths of several micrometers to several hundred kilometers.

The thus-constructed heat transfer circuit system serves as a system where a heat-absorbing portion (i.e. a negative thermal energy source) and a heat-generating portion (i.e. a positive thermal energy source) are disposed an arbitrary distance away from one another so that these two positive and negative thermal energy sources may be used independently of one another.

When a current is supplied from the external direct-current power supply 300 (Vex) to the circuit system shown in FIG. 10, an endothermic phenomenon and an exothermic phenomenon occur at the both ends of the thermoelectric conversion elements 100 and 200 due to the Peltier effect. It is thus confirmed that the Peltier effect is effective in the construction where the thermoelectric conversion element 100 as the heat-absorbing side and the thermoelectric conversion element 200 as the heat-generating side are provided independently of one another. Moreover, it is confirmed that, in this case, reversing the direction of the supplied current results in inverting the endothermic phenomenon and the exothermic phenomenon at the both ends.

Figure 9:
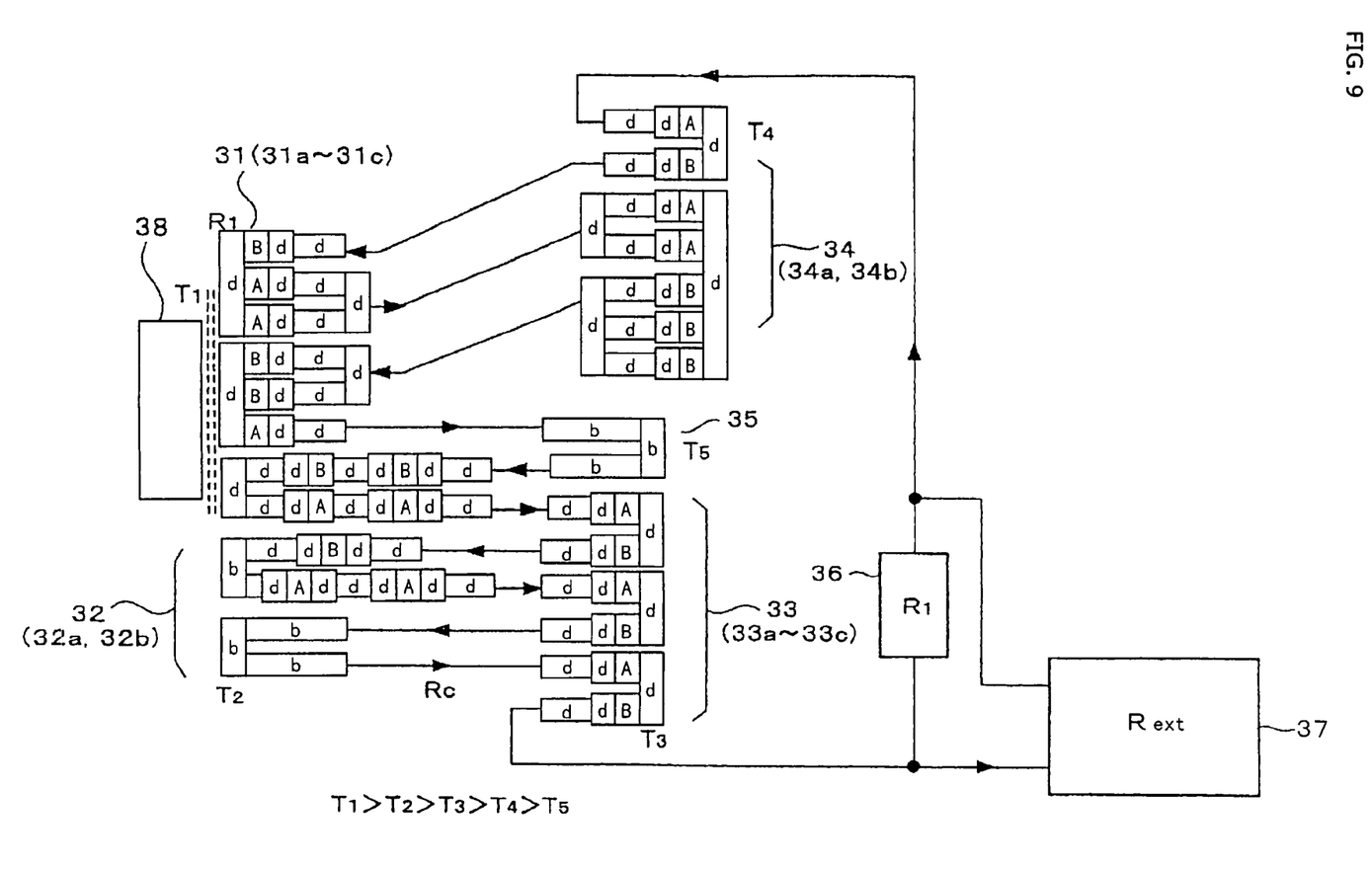
FIG. 9 is a schematic diagram showing a modified application of the system for converting thermal energy to electric energy, and supplying it to an external load, according to an embodiment of the present invention.
Figure 11:
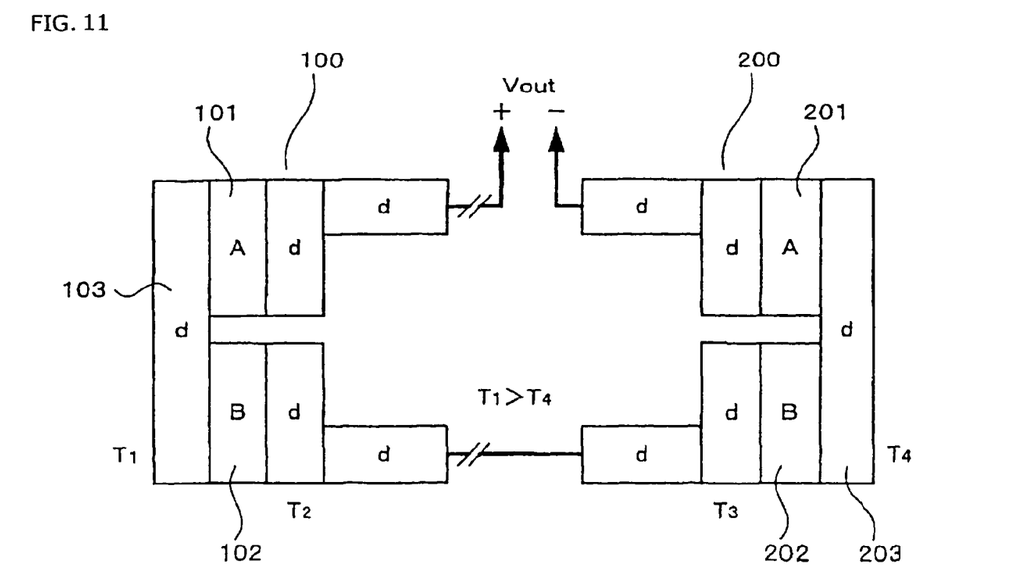
FIG. 11 is a schematic diagram showing an example of a conventional thermal energy to electric energy conversion circuit system utilizing the Seebeck effect.

FIG. 11 is a schematic diagram showing a circuit system for confirming the Seebeck effect where the external direct-current power supply 300 is removed from the circuit system of FIG. 10, i.e. a thermal energy to electric energy conversion circuit system. In FIG. 9, it is confirmed that, when a temperature difference of about 80° C. is imposed between the end of the thermoelectric conversion element 100 and the thermoelectric conversion element 200, that is, between the joining member d103 and the joining member d203, an electromotive force of 0.2 millivolt is generated between the terminals from which the power supply is removed.

It is confirmed that the Seebeck effect holds also in the construction where the thermoelectric conversion element 100 as the cooling side and the thermoelectric conversion element 200 as the heating side are provided independently of one another.

In the circuit system shown in FIG. 11, the length of the conductive material is adjusted (within a range from small lengths of several micrometers to several hundred kilometers as necessary) so that the thermoelectric conversion element 100 and the thermoelectric conversion element 200 do not thermally interfere with one another. A portion of the conductive material is cut to provide output voltage terminals. One end of the thermoelectric conversion element 100 (the joining member d103) and one end of the thermoelectric conversion element 200 (the joining member d203) are disposed under different temperature environments. The temperature difference between the temperatures T1 and T2 in the respective environments, T1−T2 (or T2−T1), is maintained finite. Thus, it is possible to convert thermal energy existing in a different environment directly to electric energy, and to serve as a power source.

The Seebeck effect serves to convert a temperature difference directly into electric energy. This effect can be obtained at least by ensuring a distance with which a relationship of T1>T4 (or T1<T4) holds. Therefore, it is necessary to ensure a distance with which the thermoelectric conversion element 100 and the thermoelectric conversion element 200 do not thermally interfere with one another.

Patent document 1: Japanese Patent Application Publication No. 2003-92433.

However, such a circuit as described with reference to the schematic diagrams of FIGS. 10 and 11 requires an external direct-current power supply 300 for long distance thermal energy transfer, or requires terminals for obtaining an electromotive force in conversion from thermal energy to electric energy. When the conventional technique as disclosed in patent document 1 is proposed, the use of energy with the Peltier element and the Seebeck element is unidirectional. For example, there is no technical teaching of constructing a recycling system to recycle energy once converted into thermal form, foreclosing the associated external power supply, and reducing the accompanying noises in parallel.

However, it is desired in the future to use thermal energy so as not to cause global warming and environmental destruction, and to avoid the use of energy due to the provision of an external power supply in parallel with recycling. Moreover, in order to protect surrounding environments, it is necessary to reduce actively noises. This is a major required challenge in developing the technique to use thermal energy in the future.

SUMMARY OF INVENTION

It is an object of the present invention to provide a thermal energy transfer circuit system, a thermal energy resource to electric energy conversion and supply system, and a thermal energy resource to chemical energy resource conversion and storage system.

Specifically, it is an object to omit an involved power supply itself, and to reduce noises. It is an object to provide a system to convert thermal energy existing in an adjacent region such as a space, etc. where the temperature of a building, an object, etc. under the influence of an external heat originating from electrical devices, combustion devices, their related devices, sunlight, geothermal heat, etc., directly to electric energy, and to transfer the generated thermal energy automatically from a space, etc. where thermal energy is generated, to a remote space, etc. Moreover, it is an object to save energy entirely in a system by recycling the generated thermal energy.

More specifically, there is provided a thermal energy transfer circuit system comprising: a pair of thermoelectric conversion elements each including first and second conductive members having different Seebeck coefficients, and a joining member joining the first and second conductive members together; a conductive coupling member electrically connecting a portion of the first conductive member of one of the thermoelectric conversion elements, the portion being opposed to the joining member, to a portion of the first conductive member of the other of the thermoelectric conversion elements, the portion being opposed to the joining member; a conductive coupling member electrically connecting a portion of the second conductive member of one of the thermoelectric conversion elements, the portion being opposed to the joining member, to a portion of the second conductive member of the other of the thermoelectric conversion elements, the portion being opposed to the joining member; the thermoelectric conversion elements having respective one end portions disposed under different temperature environments; the conductive coupling members establishing the connections for such a distance that a relationship of Tm>Tn holds where Tm represents a temperature of the one end portion of one of the thermoelectric conversion elements on a higher temperature side, and Tn represents a temperature of the one end portion of the other of the thermoelectric conversion elements on a lower temperature side; and open ends in a circuit system including the pair of thermoelectric conversion elements, the open ends being short-circuited to one another so as to close the circuit system as a whole, wherein thermal energy is transferred to a remote place with no external power supply.

Moreover, there is provided a thermal energy resource to electric energy conversion system comprising: a plurality of thermoelectric conversion elements each including first and second conductive members having different Seebeck coefficients, and a joining member joining the first and second conductive members together; a conductive coupling member electrically connecting a portion of the first conductive member of at least one of the thermoelectric conversion elements, the portion being opposed to the joining member, to one of a heat-absorbing end portion and a heat-dissipating end portion; a conductive coupling member electrically connecting a portion of the second conductive member of the at least one of the thermoelectric conversion elements, the portion being opposed to the joining member, to the one of the heat-absorbing end portion and heat-dissipating end portion; a conductive coupling member electrically connecting a portion of the first conductive member of each of the thermoelectric conversion elements other than the at least one of the thermoelectric conversion elements, the portion being opposed to the joining member, to a portion of the first conductive member of one of the thermoelectric conversion elements other than the each of the thermoelectric conversion elements, the portion being opposed to the joining member; a conductive coupling member electrically connecting a portion of the second conductive member of each of the thermoelectric conversion elements other than the at least one of the thermoelectric conversion elements, the portion being opposed to the joining member, to a portion of the second conductive member of one of the thermoelectric conversion elements other than the each of the thermoelectric conversion elements, the portion being opposed to the joining member; the thermoelectric conversion elements having respective one end portions, the one end portions and the one of the heat-absorbing end portion and heat-dissipating end portion being disposed under a plurality of different temperature environments; the conductive coupling members establishing the connections for such a distance that a relationship of Tm>Tn holds where Tm represents a temperature of the one end portion of a plurality of the thermoelectric conversion elements on a higher temperature side or the heat-absorbing end portion, and Tn represents a temperature of the one end of a plurality of the thermoelectric conversion elements on a lower temperature side or the heat-dissipating end portion; and open ends in a circuit system including the thermoelectric conversion elements and the one of the heat-absorbing end portion and heat-dissipating end portion, the open ends being short-circuited to one another so as to close the circuit system as a whole, wherein thermal energy is converted to electric energy.

According to another aspect of the present invention, there is provided the thermal energy resource to electric energy conversion system, further comprising an external load device, and a circuit-switching switch, wherein the portion of the first conductive member of at least one of the thermoelectric conversion elements, the portion being opposed to the joining member, is connected to the external load device through a conductive coupling member and the circuit-switching switch; the portion of the second conductive member of the at least one of the thermoelectric conversion elements, the portion being opposed to the joining member, is connected to the external load device through a conductive coupling member and the circuit-switching switch; and the circuit-switching switch is switched in response to a change in relationship in magnitude among the temperature environments so as to maintain constantly an output voltage of the energy conversion circuit system in one direction.

According to another aspect of the present invention, there is provided the thermal energy resource to electric energy conversion system, wherein at least one of the first and second conductive members is connected to the joining member through a conductive coupling member.

According to another aspect of the present invention, there is provided the thermal energy resource to electric energy conversion system, wherein the first conductive member is connected to another first conductive member in series through a conductive coupling member, and/or the second conductive member is connected to another second conductive member in series through a conductive coupling member.

According to another aspect of the present invention, there is provided the thermal energy resource to electric energy conversion system, wherein the first conductive member is connected to another first conductive member in parallel through a conductive coupling member, and/or the second conductive member is connected to another second conductive member in parallel through a conductive coupling member.

Moreover, there is provided a thermal energy resource to chemical energy resource conversion and storage system comprising: a plurality of thermoelectric conversion elements each including first and second conductive members having different Seebeck coefficients, and a joining member joining the first and second conductive members together; a conductive coupling member electrically connecting a portion of the first conductive member of at least one of the thermoelectric conversion elements, the portion being opposed to the joining member, to one of a heat-absorbing end portion and a heat-dissipating end portion; a conductive coupling member electrically connecting a portion of the second conductive member of the at least one of the thermoelectric conversion elements, the portion being opposed to the joining member, to the one of the heat-absorbing end portion and heat-dissipating end portion; a water electrolyzer circuit including a hydrogen-generating electrode and an oxygen-generating electrode electrically connected through a conductive coupling member to a portion of the first conductive member of at least one of the thermoelectric conversion elements, the portion being opposed to the joining member, and a portion of the second conductive member of the at least one of the thermoelectric conversion elements, the portion being opposed to the joining member; a conductive coupling member electrically connecting a portion of the first conductive member of each of the thermoelectric conversion elements other than the at least one of the thermoelectric conversion elements, the portion being opposed to the joining member, to a portion of the first conductive member of one of the thermoelectric conversion elements other than the each of the thermoelectric conversion elements, the portion being opposed to the joining member; a conductive coupling member electrically connecting a portion of the second conductive member of each of the thermoelectric conversion elements other than the at least one of the thermoelectric conversion elements, the portion being opposed to the joining member, to a portion of the second conductive member of one of the thermoelectric conversion elements other than the each of the thermoelectric conversion elements, the portion being opposed to the joining member; the thermoelectric conversion elements having respective one end portions, the one end portions and the one of the heat-absorbing end portion and heat-dissipating end portion being disposed under a plurality of different temperature environments; the conductive coupling members establishing the connections for such a distance that a relationship of Tm>Tn holds where Tm represents a temperature of the one end portion of a plurality of the thermoelectric conversion elements on a higher temperature side or the heat-absorbing end portion, and Tn represents a temperature of the one end of a plurality of the thermoelectric conversion elements on a lower temperature side or the heat-dissipating end portion; and open ends in a circuit system including the thermoelectric conversion elements and the one of the heat-absorbing end portion and heat-dissipating end portion, the open ends being short-circuited to one another so as to close the circuit system as a whole, wherein thermal energy is converted to chemical energy with no external power supply, and the chemical energy is stored.

According to another aspect of the present invention, there is provided the thermal energy resource to chemical energy resource conversion and storage system, further comprising a circuit-switching switch, wherein the hydrogen-generating electrode and oxygen-generating electrode of the water electrolyzer circuit are electrically connected through the conductive coupling member and the circuit-switching switch to the portion of the first conductive member of at least one of the thermoelectric conversion elements, the portion being opposed to the joining member, and the portion of the second conductive member of the at least one of the thermoelectric conversion elements, the portion being opposed to the joining member; and the circuit-switching switch is switched in response to a change in relationship in magnitude among the temperature environments so as to maintain constantly an output voltage of the energy conversion circuit system in one direction.

According to another aspect of the present invention, there is provided the thermal energy resource to chemical energy resource conversion and storage system, wherein at least one of the first and second conductive members is connected to the joining member through a conductive coupling member.

According to another aspect of the present invention, there is provided the thermal energy resource to chemical energy resource conversion and storage system, wherein the first conductive member is connected to another first conductive member in series through a conductive coupling member, and/or the second conductive member is connected to another second conductive member in series through a conductive coupling member.

According to another aspect of the present invention, there is provided the thermal energy resource to chemical energy resource conversion and storage system, wherein the first conductive member is connected to another first conductive member in parallel through a conductive coupling member, and/or the second conductive member is connected to another second conductive member in parallel through a conductive coupling member.

BEST MODE(S) FOR CARRYING OUT THE INVENTION

The following describes embodiments of a thermal energy transfer circuit system, a thermal energy resource to electric energy conversion and supply system, and a thermal energy resource to chemical energy resource conversion and storage system, according to the present invention, with reference to the drawings, etc.

Figure 1:
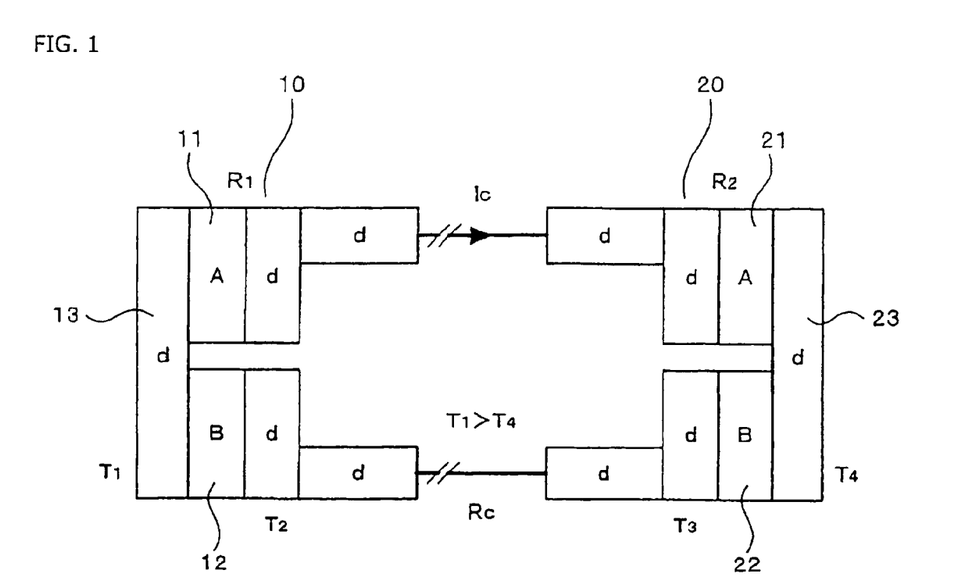
FIG. 1 is a schematic diagram of a non-power-supply thermoelectric effect thermal energy transfer circuit system with no external power supply according to the present invention.

FIG. 1 is a schematic diagram showing an example of a non-power-supply thermoelectric effect thermal energy transfer circuit system with no external power supply.

As shown in FIG. 1, two thermoelectric conversion elements 10 and 20 are provided so as to face one another. Each thermoelectric conversion element 10 (20) is constructed by joining together a first conductive member A11 (A21) and a second conductive member B12 (B22) having different Seebeck coefficients by a joining member d13 (d23) made of a material having a high thermal conductivity and electrical conductivity (for example, copper, gold, platinum, and aluminum). This construction is the same as the conventional example described with reference to FIGS. 10 and 11.

The surface of the first conductive member A11 and the second conductive member B12 of the thermoelectric conversion element 10 which are opposed to the joining member d13, and the surface of the first conductive member A21 and the second conductive member B22 of the thermoelectric conversion element 20 which are opposed to the joining member d23, are connected by a conductive material having a high thermal conductivity (for example, a wiring material made of copper, gold, platinum, aluminum, etc.), respectively. No external direct-current power supply 300 (Vex) is provided on the line connecting the first conductive members of the thermoelectric conversion element 10 and the thermoelectric conversion element 20 and the line connecting the second conductive members thereof, so as to form a non-power-supply drive type circuit system.

In FIG. 1, the thermoelectric conversion element 10 and the thermoelectric conversion element 20 are disposed under different temperature environments. The thermoelectric conversion element 10 is on a higher temperature side at a temperature T1, while the thermoelectric conversion element 20 is on a lower temperature side at a temperature T4. A distance is ensured so that a relationship of T1>T4 holds. A thermal energy to electric potential energy direct energy conversion electric circuit system is thus constructed. In order to close the entire electric circuit system, open ends in the circuit are short-circuited.

A current flows in the electric circuit system by the electric energy generated by the Seebeck effect. This enables to transfer the thermal energy from the higher temperature side to the lower temperature directly and electrically by the Peltier effect and the Thomson effect. A non-power-supply thermoelectric effect thermal energy transfer circuit system is thus realized. Incidentally, the Thomson effect is a phenomenon where heat absorption occurs on the higher temperature side and heat generation occurs on the lower temperature side when a current flows under condition that the end of conductors same in the Seebeck effect are disposed under different temperature environments.

The circuit system shown in FIG. 1 requires no cooling fan and no mechanical power section. This enables to reduce thermal energy due to additional heat engines, and to reduce noises due to forced air cooling and forced cooling utilizing electric energy from an external power supply.

Figure 2:
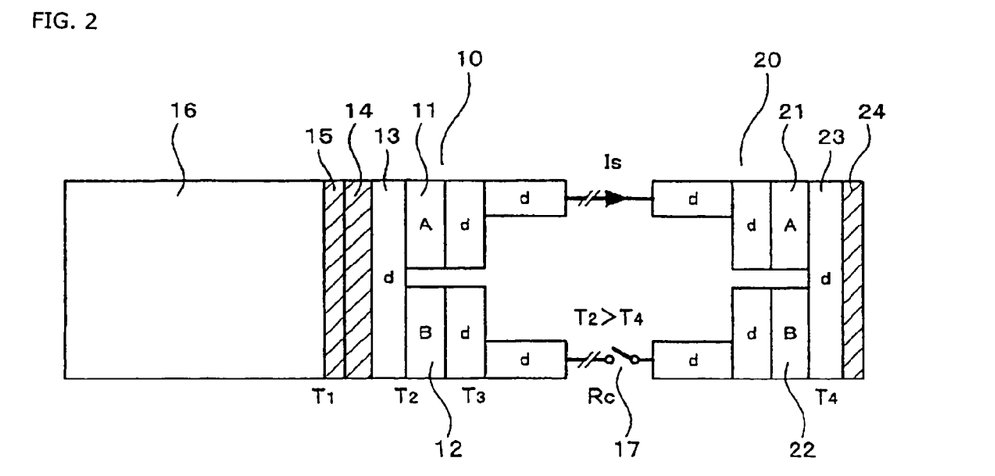
FIG. 2 is a schematic diagram showing an example of an experimental circuit for demonstrating a non-power-supply thermoelectric effect thermal energy transfer circuit system with no external power supply according to the present invention.

FIG. 2 shows an experimental circuit for demonstrating the non-power-supply thermoelectric effect thermal energy transfer circuit system shown in FIG. 1. The same symbols as in FIG. 1 are given for description.

The circuit on the right side of FIG. 2 is provided with a switch 17 as compared to the thermal energy transfer circuit shown in FIG. 1. By turning the switch on and off, the circuit changes over between a short-circuit state and an open state.

The thermoelectric conversion element 10 on the left side of FIG. 2 is provided with an external heat supply system 16. The external heat supply system 16 is electrically insulated from but thermally joined to an anodic oxide layer 15. An anodic oxide layer 14 is attached to the joining member 13 of the thermoelectric conversion element 10. The external heat supply system 16 is joined to the anodic oxide layer 14 thorough the anodic oxide layer 15. The external heat supply system 16 supplies the temperature T1 to the joining member 13 of the thermoelectric conversion element 10. The joining member 23 of the thermoelectric conversion element 20 on the right side is electrically insulated from but thermally connected to an anodic oxide layer 24 having a high thermal conductivity.

For example, each of the circuit comprising the thermoelectric conversion element 10 on the left side and the circuit comprising the thermoelectric conversion element 20 on the right side comprises a circuit including twenty five pairs of pi-type Peltier elements which are connected in series. The resistance of each circuit including the Peltier element section is equal to 0.30Ω.

In the circuit, a portion under a temperature T3 and a portion under a temperature T4 are in such positions that the endothermic and exothermic effects due to the Peltier effect therein are inverse with respect to a portion under a temperature T2. Accordingly, the temperature of the portion of T3 and the temperature of the portion of T4 change conversely with respect to the portion of T2. Therefore, it is theoretically predicted that the temperature of the portion of T3 and the temperature of the portion of T4 change in synchronization with one another.

This circuit is used for an experiment performed according to the following process.

First, (1) the external heat supply system 16 is driven by an external power supply not shown, and the switch 17 in a self-complete drive type thermal energy transfer circuit on the right side is opened. Under that condition, a state of thermal equilibrium is established among a heat generated due to the Peltier effect, thermal conduction in the circuit, and the air surrounding the circuit so that the temperatures T1, T2, T3 and T4 of the portions in FIG. 2 become steady-state values substantially.

Figure 3:
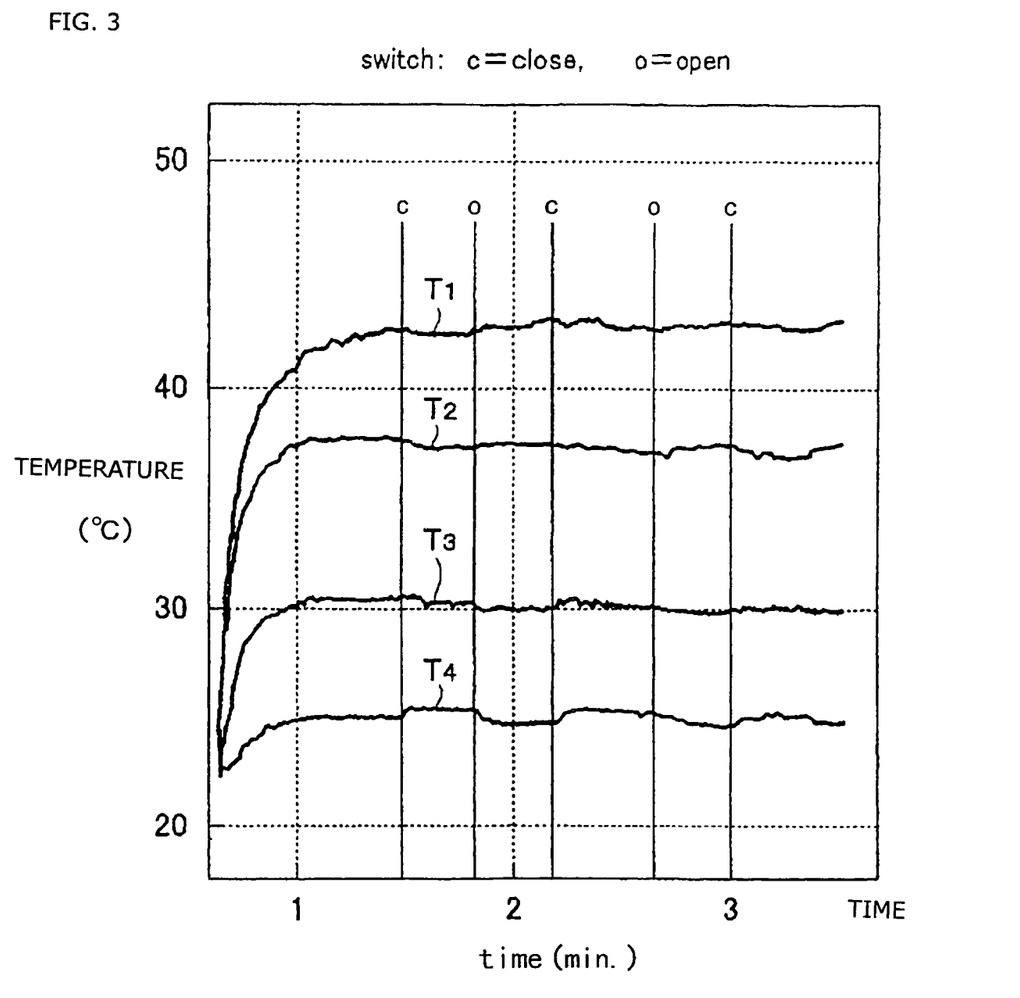
FIG. 3 is a diagram showing a result of a demonstration with the non-power-supply thermoelectric effect thermal energy transfer circuit system with no external power supply in FIG. 2.

Second, (2) when the temperatures T1, T2, T3 and T4 are substantially in state of thermal equilibrium, then the switch 17 in the self-complete drive type thermal energy transfer circuit on the right side is repeatedly short-circuited (closed) and opened. It is determined how the temperatures T1, T2, T3 and T4 change with time. FIG. 3 shows by plot pattern how the temperatures T1, T2, T3 and T4 change in accordance with the short-circuiting and opening of the switch 17. In FIG. 3, the vertical lines represented by the symbols (c) and (o) indicate the time when the switch 17 is short-circuited and the time when the switch 17 is opened, respectively. The horizontal axis is indicative of elapsed time, while the vertical axis is indicative of temperatures (° C.). When in the open state, the electromotive force due to the Seebeck effect in the self-complete drive type thermal energy transfer circuit on the right side is equal to about 50 mV.

As shown in FIG. 3, when the switch 17 is short-circuited, the temperatures T1, T2 and T3 of the portions closer to the left circuit system fall, while the temperature T4 of the right circuit rises. This indicates that thermal energy is transferred within the circuit due to the Peltier effect. This result is theoretically expected. The temperatures T2 and T4 change conversely. The temperatures T3 and T4 repeatedly decrease and increase in synchronization with one another.

The foregoing experimental result demonstrates and confirms the principle of the non-power-supply thermoelectric effect thermal energy transfer circuit system. Here, the electromotive force due to the Seebeck effect is equal to a small value of about 50 mV, since the number of pi-type Peltier element pairs is equal to a relatively small value of 25 in the non-power-supply thermal drive type circuit. When in the short-circuited state, the current value is equal to about 0.17 A.

However, if a circuit system is constructed by setting the number of pi-type Peltier element pairs in the non-power-supply thermal drive type circuit on the right side thirty times as large as the number of the thermoelectric conversion elements used in the demonstration, i.e. by setting to 750, the electromotive force due to the Seebeck effect, which is proportional to the number of pi-type Peltier element pairs, is equal to about 1.5V. it is expected that when the circuit resistance is reduced to a low value of about 0.5Ω, a short-circuit current of 3 to 4 A flows to transfer ten times the thermal energy in the experiment.

Figure 4:
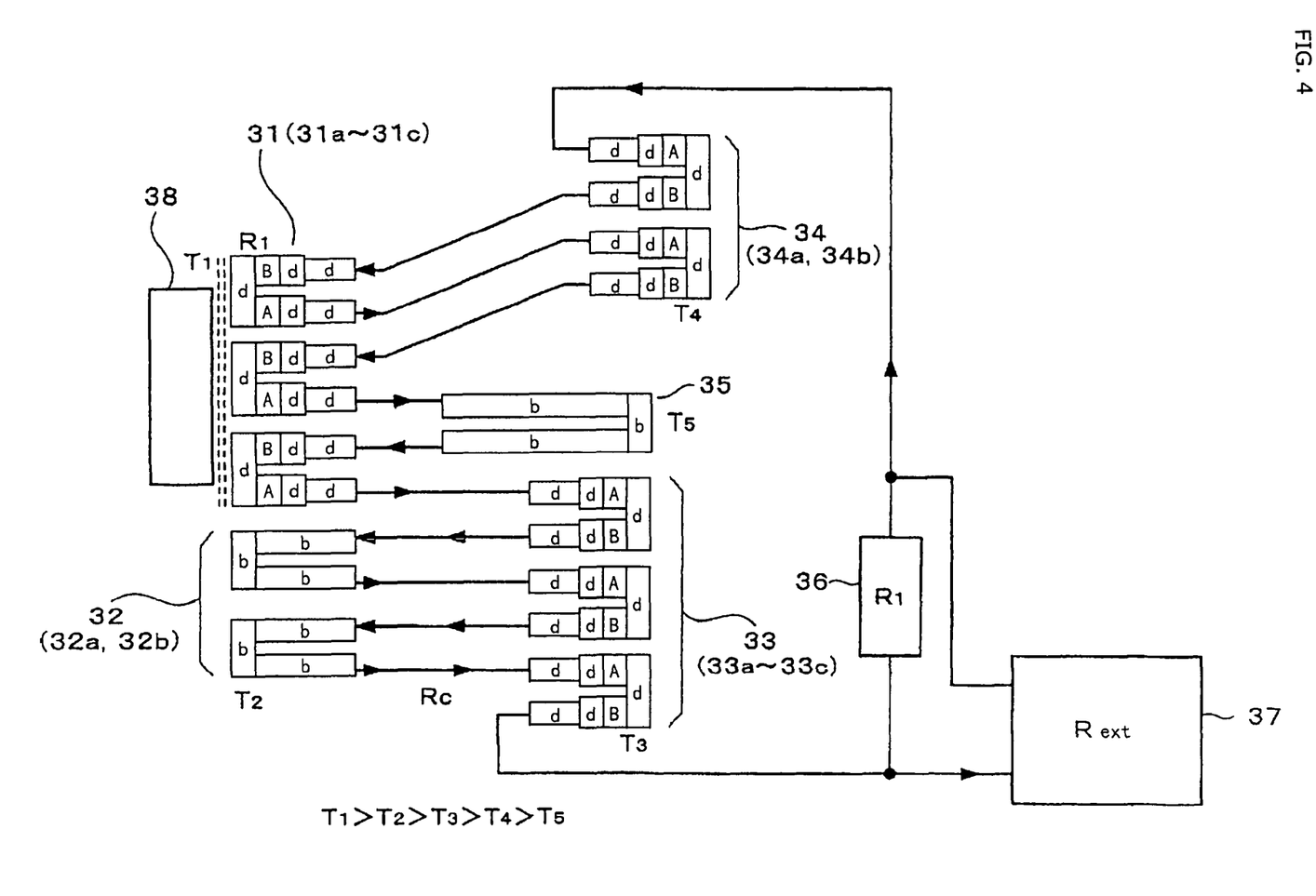
FIG. 4 is a schematic diagram showing an example of a system for converting thermal energy to electric energy, and supplying it to an external load according to an embodiment of the present invention.

Next, a second embodiment of the present invention is described with reference to FIG. 4. FIG. 4 is a schematic diagram showing a system for utilizing a thermal energy resource, converting it into electric energy, and supplying it to an external load circuit 37, i.e. a thermal energy resource to electric energy resource conversion and supply system.

As shown in FIG. 4, in the thermal energy resource to electric energy resource conversion and supply system, one or more thermoelectric conversion elements or conductive coupling members are disposed in five different temperature environments. Thermal energy of an external temperature T1 is supplied from an external heat source 38 that exists in the natural world or made artificially, to a joining member d that joins together a first conductive member A and a second conductive member B of each of thermoelectric conversion elements 31a to 31c constituting a first thermoelectric conversion element group 31. Thus, the first thermoelectric conversion element group 31 is disposed under a temperature environment of the highest temperature T1.

A conductive coupling member 32 (32a, 32b) is disposed under a temperature environment of the second highest temperature T2 (T2<T1). As shown in the figure, the conductive coupling member 32 is formed as a Π-type conductive member comprising two conductive members disposed in parallel and a conductive member of the same material which couples the end of the two parallel conductive members. For example, the conductive coupling member 32 may be formed of copper, gold, platinum, aluminum, etc.

Thermoelectric conversion elements 33a and 33b, which constitute a second thermoelectric conversion element group 33, are disposed under a temperature environment of the third highest temperature T3 (T3<T2). The temperature of a joining member d joining together a first conductive member A and a second conductive member B of each of the thermoelectric conversion elements 33a and 33b is held at the temperature T3.

Thermoelectric conversion elements 34a and 34b, which constitute a third thermoelectric conversion element group 34, are disposed under a temperature environment of a temperature T4 lower than the temperature T3. The temperature of a joining member d joining together a first conductive member A and a second conductive member B of each of the thermoelectric conversion elements 34a and 34b is held at the forth temperature T4.

A conductive coupling member 35 is disposed under a temperature environment of the lowest temperature T5. As in the case of the conductive coupling member 32, the conductive coupling member 35 is formed as a Π-type conductive member comprising two conductive members disposed in parallel and a conductive member of the same material which couples the end of the two parallel conductive members. The material of the conductive coupling member 35 may be identical with or different from that of the conductive coupling member 32.

The thermoelectric conversion elements 31, 33 and 34, and the conductive coupling members 32 and 35, which are disposed under those different temperature environments (T1 to T5), are connected by a conductive wiring material as shown in FIG. 4. Specifically, of the plurality of the thermoelectric conversion elements 31 disposed under the temperature environment T1, the thermoelectric conversion elements 31a and 31b are connected to the thermoelectric conversion elements 34a and 34b of the third thermoelectric conversion element group 34 under the temperature environment T4, respectively, as shown in the figure. This connection is implemented by connecting the first conductive members, each of which constitutes a respective thermoelectric conversion element, to one another, and the second conductive members, each of which constitutes each thermoelectric conversion element, to one another, by the wiring material. The thermoelectric conversion elements are thus cascaded.

The first conductive member of the thermoelectric conversion element 31b under the temperature environment T1 is connected to one terminal of the pi-type conductive coupling member 35 disposed under the temperature environment T5. The other terminal of the conductive coupling member 35 is connected to the second conductive member of the thermoelectric conversion element 31c. The thermoelectric conversion elements 31b and 31c are thus cascaded.

Similarly, the first conductive member of the thermoelectric conversion element 31c under the temperature environment T1 is connected to the first conductive member of the thermoelectric conversion element 33a disposed under the temperature environment T3. Moreover, as shown in the figure, the thermoelectric conversion element 33 disposed under the temperature environment T3 and the conductive coupling member 32 disposed under the temperature environment T2 are repeatedly connected to one another by the wiring material. Finally, the second conductive member of the last step of the thermoelectric conversion element 33 under the temperature environment T3 is connected to one end of the load resistance 36. The other end of the load resistance 36 is connected to the first conductive member of the thermoelectric conversion element 34a. The voltage between the both ends of the load resistance 36 is supplied to the external load circuit 37.

Figure 5:
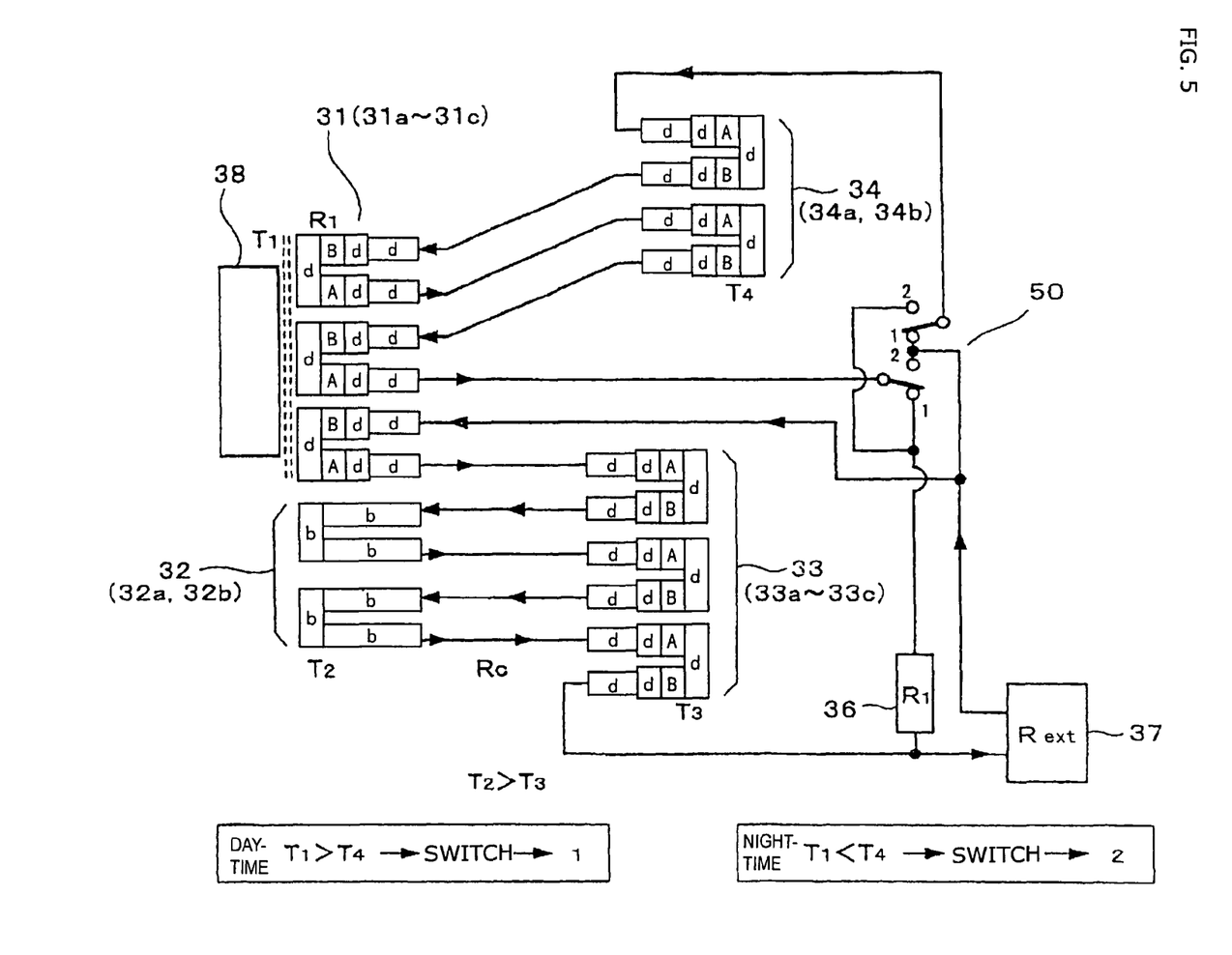
FIG. 5 is a schematic diagram showing a modified example of the system for converting thermal energy to electric energy, and supplying it to an external load according to an embodiment of the present invention.

FIG. 5 shows a modified example of the system shown in FIG. 4 for utilizing a thermal energy resource, converting it into electric energy, and supplying it to the external load circuit 37. Specifically, although the first conductive member A of the thermoelectric conversion element 31b and the second conductive member B of the thermoelectric conversion element 31c are connected to one another by the conductive coupling member 35 in the example of FIG. 4, the first conductive member A of the thermoelectric conversion element 31b and the second conductive member B of the thermoelectric conversion element 31c are connected to a circuit-switching switch 50 instead of the conductive coupling member 35 of FIG. 4, and connected to the external load circuit 37 through the circuit-switching switch 50 in the modified example shown in FIG. 5.

The circuit-switching switch 50 is switched, when a relationship in magnitude between the temperature environment T1 for the thermoelectric conversion element group 31 and the temperature environment T4 for the thermoelectric conversion element group 34 varies. For example, it is switched, when the relationship is inverted between the daytime and nighttime. This serves to control the direction of a current flowing through the external load circuit 37 constantly in one direction.

For example, under the temperature environments of T1>T4 in the daytime, the circuit-switching switch 50 is connected to the side of (1) in FIG. 5, so that a current flows through the external load circuit 37 in the direction of the arrow in the circuit in the figure, depending on the polarity of the Seebeck electromotive force. When the temperature environments vary to the temperature environments of T1<T4, for example when time elapses into the nighttime so that the temperature relationship is inverted, the polarity of the Seebeck electromotive force is inverted with respect to the state prior to the change in the temperature environments (for example, in the daytime). By switching the connection of the circuit so that the circuit-switching switch 50 is connected to the side of (2) in FIG. 5, the direction of the current flowing through the external load circuit 37 is the same as in the state prior to the change in the temperature environments (for example, in the daytime). That is, the current flows in the direction of the arrow in the circuit in the figure. Thus, it is possible to control the direction of the current flowing through the external load circuit 37 constantly in one direction by switching the connection of the circuit-switching switch 50 in accordance with variation in the temperature environments (for example, between the daytime and nighttime).

In the embodiment shown in FIG. 5, there is provided only one circuit-switching switch 50. Naturally, it is however possible to obtain similar effects as described above by providing a plurality of switches when there are a plurality of different temperature environments.

Figure 6:
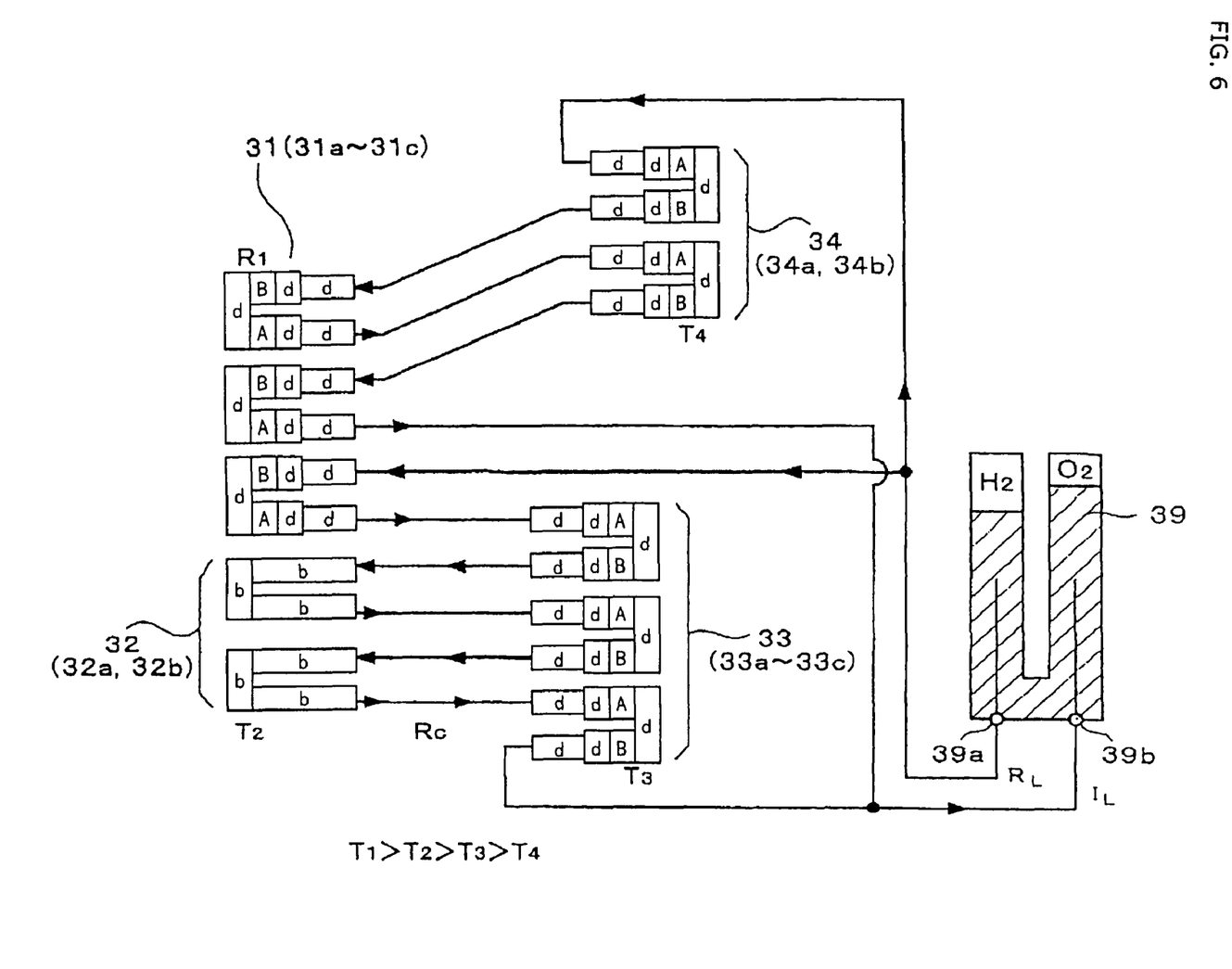
FIG. 6 is a schematic diagram showing an example of a conversion to chemical energy resource and storage system for converting thermal energy to chemical energy, and storing it in the form of hydrogen or oxygen, according to an embodiment of the present invention.

FIG. 6 shows an application utilizing a water electrolyzer 39 as an external load, i.e. a system for utilizing thermal energy, converting it to chemical energy, and storing it in the form of chemical energy.

The application shown in FIG. 6 differs from the first embodiment shown in FIG. 4 in that the water electrolyzer 39 is provided in the position where the conductive coupling member 35 is disposed in FIG. 4.

In the conversion to chemical energy resource and storage system of FIG. 6, the first conductive member A of the thermoelectric conversion element 34a is connected to a hydrogen-generating electrode 39a of the water electrolyzer 39, while the second conductive member B of the thermoelectric conversion element 33c is connected to an oxygen-generating electrode 39b of the water electrolyzer.

The thermoelectric conversion elements 34a and 34b are cascaded with the thermoelectric conversion elements 31a and 31b, as in the example of FIG. 4. The first conductive member A of the thermoelectric conversion element 31b is connected to the oxygen-generating electrode 39b of the water electrolyzer 39 as described above. The hydrogen-generating electrode 39a of the water electrolyzer 39 is connected to the second conductive member of the thermoelectric conversion element 31c.

The first conductive member A of the thermoelectric conversion element 31c is connected to the first conductive member A of the thermoelectric conversion element 33a. The second conductive member B of the thermoelectric conversion element 33a is cascaded to the first conductive member A of the thermoelectric conversion element 33c through the conductive coupling member 32 that is disposed under the temperature environment T2.

In the thus-constructed conversion to chemical energy resource and storage system utilizing a thermal energy resource, a current flows in the direction of the arrow due to the Seebeck effect dependent on the temperature differences among the heat source 38 supplying the temperature environment T1 to the thermoelectric conversion element 31, the conductive coupling member 32 under the temperature environment lower than that (T2), the thermoelectric conversion element 33 (T3), and the thermoelectric conversion element 34 (T4).

The current serves to electrolyze the water stored within the water electrolyzer 39, and thereby to generate hydrogen $H_2$ and oxygen $O_2$.

Figure 7:
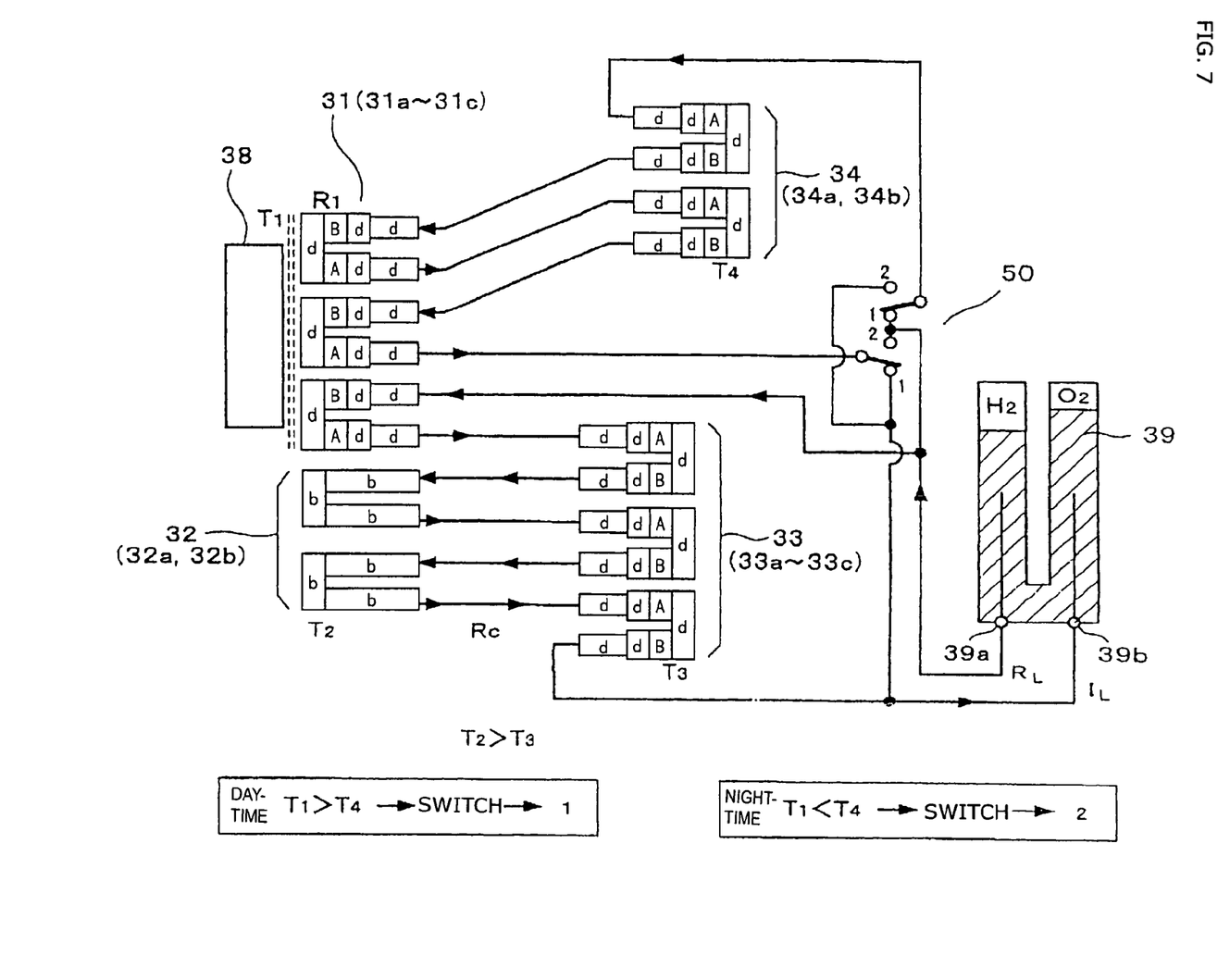
FIG. 7 is a schematic diagram showing a modified example of the conversion to chemical energy resource and storage system for converting thermal energy to chemical energy, and storing it in the form of hydrogen or oxygen, according to an embodiment of the present invention.

FIG. 7 shows an example where the example shown in FIG. 5 which utilizes the circuit-switching switch is applied to the example of FIG. 6 which utilizes the water electrolyzer 39. Specifically, in the example of FIG. 6, the first conductive member A of the thermoelectric conversion element 31b is connected to the oxygen-generating electrode 39b of the water electrolyzer 39 through the conductive wiring material. The hydrogen-generating electrode 39a of the water electrolyzer 39 is connected to the second conductive member of the thermoelectric conversion element 31c. The circuit is thus formed. On the other hand, in FIG. 6, the first conductive member A of the thermoelectric conversion element 31b and the first conductive member A of the thermoelectric conversion element 34a are connected to the oxygen-generating electrode 39b and the hydrogen-generating electrode 39a of the water electrolyzer 39 through the circuit-switching switch 50.

The circuit-switching switch 50 is switched, when the relationship in magnitude between the temperature environment T1 for the thermoelectric conversion element group 31 and the temperature environment T4 for the thermoelectric conversion element group 34 varies. For example, it is switched, when the relationship is inverted between the daytime and nighttime. This serves to control the direction of a current flowing through the water electrolyzer 39 constantly in one direction. Thus, it is possible to store hydrogen $H_2$ and oxygen $O_2$ separately in separate storage sections by the water electrolyzer 39, independently of variation in the temperature environments (for example, during both of the daytime and nighttime).

For example, under the temperature environments of T1>T4 in the daytime, the circuit-switching switch 50 is connected to the side of (1) in FIG. 5, so that a current flows through the water electrolyzer 39 in the direction of the arrow in the circuit in the figure, depending on the polarity of the Seebeck electromotive force. When the temperature environments vary to the temperature environments of T1<T4, for example when time elapses into the nighttime so that the temperature relationship is inverted, the polarity of the Seebeck electromotive force is inverted with respect to the state prior to the change in the temperature environments (for example, in the daytime). By switching the connection of the circuit so that the circuit-switching switch 50 is connected to the side of (2) in FIG. 5, the direction of the current flowing through the water electrolyzer 39 is the same as in the state prior the change in the temperature environments (for example, in the daytime). That is, the current flows in the direction of the arrow in the circuit in the figure. Thus, it is possible to control the direction of the current flowing through the water electrolyzer 39 constantly in one direction by switching the connection of the circuit-switching switch 50 in accordance with variation in the temperature environments (for example, between the daytime and nighttime).

In the embodiment shown in FIG. 7, there is provided only one circuit-switching switch 50. Naturally, it is however possible to obtain similar effects as described above by providing a plurality of switches when there are a plurality of different temperature environments.

Figure 8:
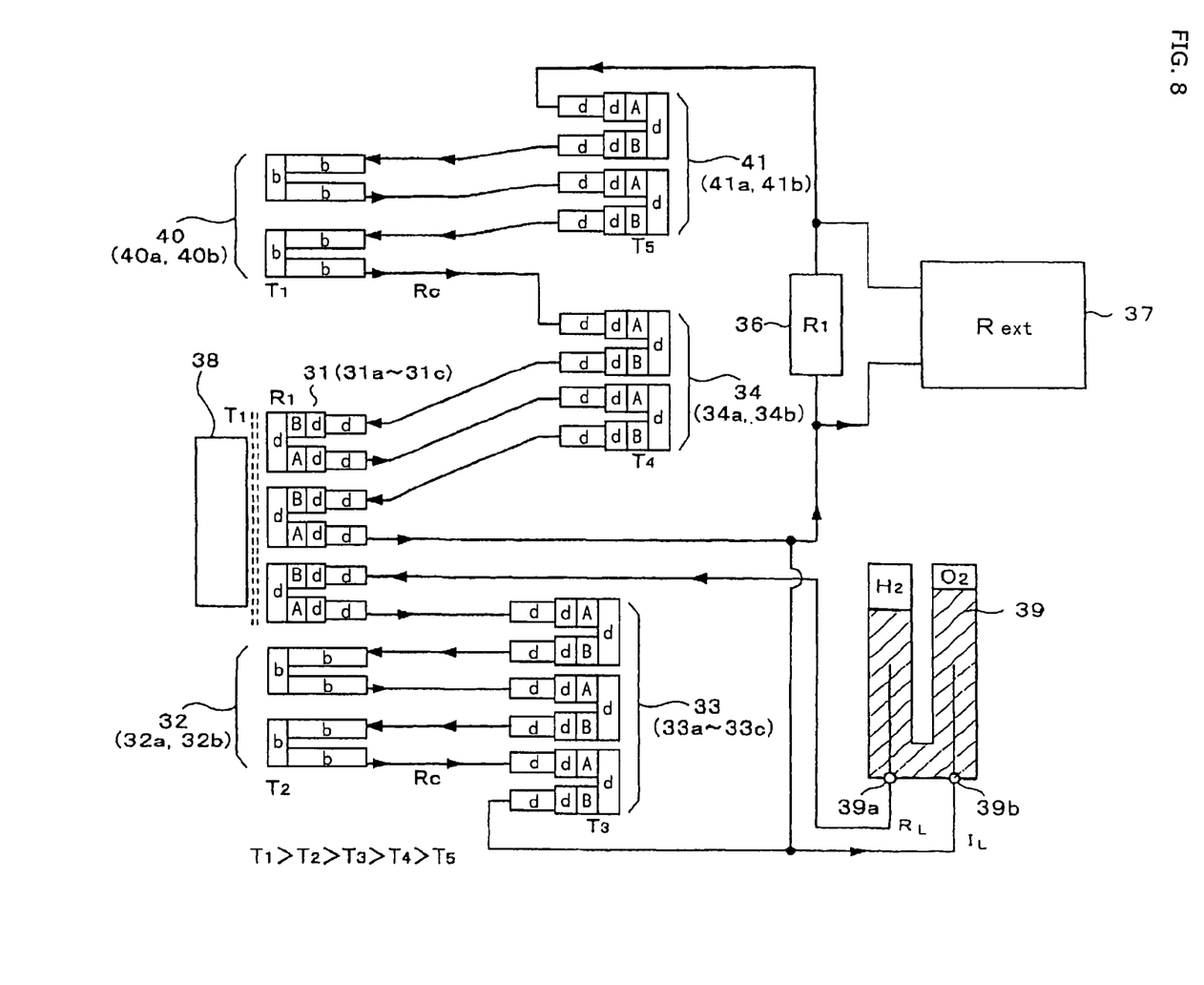
FIG. 8 is a schematic diagram showing an example of a thermal energy to electric energy conversion and supply and conversion to chemical energy and storage system including the system for converting thermal energy to electric energy, and supplying it to an external load, and the conversion to chemical energy resource and storage system for converting thermal energy to chemical energy, and storing it in the form of hydrogen or oxygen, according to an embodiment of the present invention.

FIG. 8 shows an example where the circuit shown in FIG. 4 for converting thermal energy to electric energy, and applying a voltage to a load, and the system shown in FIG. 6 for converting thermal energy to chemical energy, and storing it, are combined. Constituent parts similar as in FIGS. 4 and 6 are given the same symbols.

As shown in FIG. 8, the both ends of the load resistance 36 is connected to the thermoelectric conversion element 31 and the thermoelectric conversion element 41. The closed circuit through the thermoelectric conversion element 31, the load resistance 36 (the external load circuit 37), the thermoelectric conversion element 41, the conductive coupling member 40, the thermoelectric conversion element 34, and again the thermoelectric conversion element 31, forms a circuit for converting thermal energy to electric energy.

The closed circuit through the thermoelectric conversion element 31, the water electrolyzer 39, the thermoelectric conversion element 33, the conductive coupling member 32, the thermoelectric conversion element 31, and the water electrolyzer 39, is corresponding to the conversion to chemical energy resource and storage system. Description of each circuit system in FIG. 8 is omitted, because it is already described with reference to FIGS. 4 and 6.

According to the embodiments of the present invention, a portion of a first conductive member of a thermoelectric conversion element and a portion of a second conductive member of the thermoelectric conversion element which are opposed to a joining member (or first and second conductive members on the opposite side to the joining member) are electrically connected to a first or second conductive member of another thermoelectric conversion element or to a conductive coupling member.

One end portions of the thus-joined thermoelectric conversion elements and a heat-absorbing end portion or heat-dissipating end portion of the conductive coupling members are disposed under a plurality of different temperature environments. The conductive coupling members establish the connections for such a distance that a relationship of Tm>Tn holds where Tm represents a temperature of a plurality of the thermoelectric conversion elements on a higher temperature side or the heat-absorbing end portion, and Tn represents a temperature of a plurality of the thermoelectric conversion elements on a lower temperature side or the heat-dissipating end portion.

The foregoing enables to take out electric potential energy from any point in the plurality of conductive coupling members. It is thus possible to construct a plurality of thermal energy to electric energy direct energy conversion electric circuit systems. It is further possible to realize a function of integrating and converting thermal energy existing in a plurality of points directly into electric energy by short-circuiting open ends in the entire combined circuit system of the plurality of the electric circuit systems so that a current flows in the entire combined circuit system by the electric energy obtained at the plurality of points.

Moreover, it is possible to realize a circuit system with a function of supplying the obtained electric energy to an external circuit through output terminals attached to arbitrary points in the combined circuit system, and a function of converting electric energy to chemical energy and storing it with a water electrolyzer and a capacitor installed at arbitrary points in the combined circuit system.

Still moreover, it is possible to realize a thermal energy resource to electric energy resource conversion and supply and conversion to chemical energy resource and storage system having an integrated function of those two functions.

FIG. 9 shows a modified application of the thermal energy resource to chemical energy resource conversion and supply system shown in FIG. 4. In the thermoelectric conversion element 31a, which constitutes the thermoelectric conversion element group 31, one end of a plurality of first conductive members A (two in FIG. 9) are arranged in parallel and connected to a joining member d which serves as a heat-absorbing end portion, and a second conductive member B is also connected to the joining member d, forming a Peltier Seebeck element. The other end of the plurality of the first conductive members A are connected to another joining member d through a conductive coupling member.

In the thermoelectric conversion element 31b, which constitutes the thermoelectric conversion element group 31, one end of a plurality of second conductive members B (two in FIG. 9) are arranged in parallel and connected to a joining member d which serves as a heat-absorbing end portion, and a first conductive member A is also connected to the joining member d, forming a Peltier Seebeck element.

As shown in the thermoelectric conversion element 31a or the thermoelectric conversion element 31b, it is possible to arrange a plurality of first conductive members A or second conductive members B (two or more) in parallel. By thus connecting a plurality of first conductive members A or second conductive members B (two or more) in parallel, it is possible to reduce the number of thermoelectric conversion elements and the number of conductive coupling members, and to increase the current flowing through the conductive coupling members.

In the thermoelectric conversion element 31c, which constitutes the thermoelectric conversion element group 31, a plurality of the first conductive members A (two in FIG. 9) and a plurality of the second conductive members B (two in FIG. 9) are connected in series through the conductive coupling members, respectively. One end of the first conductive members A connected in series and the second conductive members B connected in series are connected to a joining member d through conductive coupling members, forming a Π-type Peltier Seebeck element. The joining member d is made of the same material as the conductive coupling members. Accordingly, the joining member itself is formed integrally with the coupling members in the formed of a π shape. The other end of the second conductive members B connected in series is connected to the other end of the first conductive member A of the thermoelectric conversion element 31b through the Π-type conductive coupling member 35. Similarly, the other end of the first conductive members A connected in series in the thermoelectric conversion element 31c is connected to the first conductive member of the thermoelectric conversion element 33a of the thermoelectric conversion element group 33 through conductive coupling members.

The construction of the thermoelectric conversion element 32a in the thermoelectric conversion element group 32 differs from that in FIG. 4. As shown in FIG. 9, in the thermoelectric conversion element 32a, the first conductive member A and the second conductive member B are connected to the joining member through the conductive coupling member d. Again, the joining member is formed in a Π-shape. In the thermoelectric conversion element 32a, not a plurality of second conductive members B are connected in series, but the single second conductive member B is connected to the joining member, which serves as a heat-absorbing end portion, through conductive coupling members. On the other hand, a plurality of the first conductive members A (two in FIG. 9) are connected in series through conductive coupling members d. The first conductive member A at one end is connected to the joining member d, which serves as a heat-absorbing end portion, through the conductive coupling member d.

In the thermoelectric conversion element 34b in the thermoelectric conversion element group 34, a plurality of the first conductive members A (two in FIG. 9) are arranged in parallel, and connected at one end to a joining member d, while a plurality of the second conductive members B (three in FIG. 9) are arranged in parallel, and connected at one end to a joining member d. The other end of each first conductive member A (two first conductive members A) is connected to another joining member d though a conductive coupling member, while the other end of each second conductive member B (three second conductive members B) is connected to another joining member d though a conductive coupling member.

Thus, the modified application shown in FIG. 9 differs from the embodiment shown in FIG. 4 in that a plurality of first conductive members A or second conductive members B are provided in parallel or in series in a thermoelectric conversion element (Π-type Peltier Seebeck element) of a thermoelectric conversion element group (31, 32, 34).

The reason why the plurality of the first conductive members A and the second conductive members B are provided is that when a single first conductive member A or second conductive member B, which has a sectional area larger than a conductive coupling member, is provided, it is possible that the single one is broken to fail to exhibit its functions under the influence of the place or environment where the circuit is disposed. The first conductive member A and the second conductive member B are p-type or n-type semiconductors. Accordingly, it is possible that external forces resulting from external shocks, earthquakes, etc. cause cracks in the semiconductors, and cause a disconnection and malfunction in the circuit system. With a plurality of first conductive members A and second conductive members B provided as in this example, even when cracks occur in one of them to cause a disconnection, the remaining first conductive members A or second conductive members B are connected to form a circuit and to maintain its functions. This enhances the long-term reliability of the circuit system.

Moreover, when a plurality of first conductive members A or second conductive members B are connected in parallel with a joining member d, the circuit system can serve as a constant-current power supply, supplying a large current to an external circuit. Conversely, as the proportion of parallel connection is reduced, the Seebeck electromotive force of the circuit relatively rises. Thus, the circuit system can also serve as a constant-voltage power supply, supplying a high voltage to an external circuit through a conductive coupling member.

The foregoing means that it is possible to respond flexibly to whether a load system to which electric power is supplied requires a high voltage, or a large current. That is, it is possible to provide applications by increasing and decreasing the proportion of parallel connection of the circuit configuration of a thermoelectric conversion circuit system.

Moreover, the reason why the joining member d as the heat-absorbing end portion is formed in a Π shape as shown in the thermoelectric conversion element 31c is as follows. The first conductive member A or the second conductive member B comprises a p-type or n-type semiconductor which is formed of a material whose Seebeck coefficient relatively decreases as the temperature increases. The first conductive member A or the second conductive member B is disposed away from the high temperature portions and connected through the conductive coupling member d which is formed of copper, etc. and thereby is strong against deterioration due to high temperature. This enables to use first conductive members and second conductive members within an operation temperature region away from high temperature portions.

The reason why the first conductive members A and/or second conductive members B are connected in series through the conductive coupling member d is that it is possible to increase the Seebeck electromotive force by increasing the number of thermoelectric conversion elements in series within the operation temperature region. This is because the Seebeck electromotive force is proportional to an integral of the temperature gradient in the first conductive member A and second conductive member B having Seebeck coefficients higher by two orders of magnitude than the conductive coupling member d.

The reason why the first conductive member A or the second conductive member B is not formed of a long piece but connected in series through the conductive coupling member d is that semiconductors as materials for the first second conductive members are weak against bending stresses. If the first conductive member A or second conductive member B is formed of a long piece, it is possible that external forces resulting from external shocks, earthquakes, etc. cause cracks in the semiconductors, and cause a disconnection and malfunction in the circuit system. Accordingly, the first conductive member A or second conductive member B is formed of a short piece, and connected through conductive coupling members d made of a flexible material such as a copper wire, absorbing external forces. This prevents disconnection in the circuit system and enhances the reliability for long-term use of the circuit system.

The number of the connected first conductive members A may be different from that of the connected second conductive members B as shown in the thermoelectric conversion element 32a. Even when the first conductive member A or second conductive member B is broken to cause a disconnection in the circuit system, the increased number of all the connected first conductive member A or second conductive member B enables to recover the disconnection in the circuit system by connecting by the conductive coupling member without replacing the broken part. This significantly reduces the cost for renewing the circuit system and the time for recovery.

Although the modified application shown in FIG. 9 is described as an example of the system shown in FIG. 4 for converting thermal energy to electric energy, and supplying it to an external load, it is naturally possible to realize various modified applications of the modified example shown in FIG. 5, the examples of the conversion to chemical energy resource and storage system shown in FIGS. 6 and 7, and the example of the thermal energy to electric energy conversion and supply and conversion to chemical energy and storage system shown in FIG. 8.

Although the invention has been described above by reference to certain embodiments and modifications of the invention with reference to the drawings, the invention is not limited to the embodiments described above. Naturally, the invention includes various forms within the subject matter of the present invention described in the claims.

With a non-power-supply drive system which requires no additional external power supply as in the present invention, it is possible to convert thermal energy existing in any portion, space or region of a building, an object, etc. whose temperature is high under the influence of an external heat originating from electrical devices, combustion devices, their related devices, sunlight, geothermal heat, etc., directly to electric energy, without using additional electric energy.

Moreover, it is possible to transfer automatically from a space, etc. where thermal energy is generated to a remote space, etc., the generated thermal energy, and to recycle the transferred thermal energy. The recycling of the thermal energy leads to saving energy, and using effectively thermal energy entirely in a system by removing an external power supply from the system, and obtaining a thermoelectric effect based on non-power-supply drive.

Moreover, it is possible to transfer automatically thermal energy under high temperature to a space, etc. where thermal energy is required. Accordingly, no fan and no mechanical power section is required. Therefore, it is possible to reduce noises due to forced air cooling or forced water cooling utilizing energy produced by an additional heat engine or utilizing electric energy.

Still moreover, it is possible to convert thermal energy which exists inexhaustibly in regions distant from one another in the global environment under low to high temperatures and is difficult to use, directly into the form of electric energy which is easy to use, and it is possible to supply the electric energy to electrical equipment which requires it. Thus, it is possible to store the thermal energy which is difficult to store, in a capacitor in the form of electric energy. Further, it is possible to electrolyze water with the transferred thermal energy, to convert it into hydrogen energy, and to store it. It is thus possible to construct a conversion to chemical energy resource and storage self-drive system.

The invention claimed is:

1. A thermal energy resource to electric energy conversion system comprising:
   a plurality of thermoelectric conversion elements each including first and second conductive members having different Seebeck coefficients, and a joining member joining the first and second conductive members together, wherein each thermoelectric conversion element has one end portion at which the joining member joins the first and second conductive members together, and wherein each of the first and second conductive members includes a connecting portion on a side farther from the joining member;
   a first conductive coupling member electrically connecting the connecting portion of the first conductive member of a first one of the thermoelectric conversion elements to one of a heat-absorbing end portion and a heat-dissipating end portion;
   a second conductive coupling member electrically connecting the connecting portion of the second conductive member of a second one of the thermoelectric conversion elements, to the one of the heat-absorbing end portion and heat-dissipating end portion;
   a third conductive coupling member electrically connecting the connecting portion of the first conductive member of a third one of the thermoelectric conversion elements to the connecting portion of the first conductive member of a fourth one of the thermoelectric conversion elements; and
   a fourth conductive coupling member electrically connecting the connecting portion of the second conductive member of the third thermoelectric conversion element to the connecting portion of the second conductive member of a fifth one of the thermoelectric conversion elements; wherein:
   the end portions of the thermoelectric conversion elements and the one of the heat-absorbing end portion and heat-dissipating end portion are disposed in a plurality of different temperature environments, each of which belongs to a respective one of a higher temperature side and a lower temperature side;
   the thermoelectric conversion elements and the one of the heat-absorbing end portion and heat-dissipating end portion are electrically connected to and spaced from one another by the first to fourth conductive coupling members such that a relationship of $Tm > Tn$ is constantly maintained where $Tm$ represents a temperature of the higher temperature side, and $Tn$ represents a temperature of the lower temperature side; and
   open ends in a circuit system including the thermoelectric conversion elements and the one of the heat-absorbing end portion and heat-dissipating end portion are short-circuited to one another so as to close the circuit system as a whole,
   wherein thermal energy is converted to electric energy.

2. The thermal energy resource to electric energy conversion system as claimed in claim 1, further comprising an external load device, and a circuit-switching switch, wherein the connecting portion of the first conductive member of a sixth one of the thermoelectric conversion elements is connected to the external load device through a fifth conductive coupling member and the circuit-switching switch;
   wherein the connecting portion of the second conductive member of a seventh one of the thermoelectric conversion elements is connected to the external load device through a sixth conductive coupling member and the circuit-switching switch; and
   wherein the circuit-switching switch is switched in response to a change in relationship in magnitude among the temperature environments so as to maintain constantly an output voltage of the energy conversion system in one direction.

3. The thermal energy resource to electric energy conversion system as claimed in claim 1, wherein at least one of the first and second conductive members of one of the thermoelectric conversion elements is connected to the joining member through a further conductive coupling member.

4. The thermal energy resource to electric energy conversion system as claimed in claim 1, wherein at least one of the first and second conductive members of one of the thermoelectric conversion elements includes a plurality of parts which are connected in series through a further conductive coupling member.

5. The thermal energy resource to electric energy conversion system as claimed in claim 1, wherein at least one of the first and second conductive members of one of the thermoelectric conversion elements includes a plurality of parts which are connected in parallel through a further conductive coupling member.

* * * * *